(12) United States Patent
Murakami et al.

(10) Patent No.: US 10,847,344 B2
(45) Date of Patent: Nov. 24, 2020

(54) CHARGED PARTICLE BEAM CONTROL DEVICE

(71) Applicant: HITACHI HIGH-TECH CORPORATION, Tokyo (JP)

(72) Inventors: Shinichi Murakami, Tokyo (JP); Wen Li, Tokyo (JP); Hiroyuki Takahashi, Tokyo (JP); Masazumi Tone, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/437,327

(22) Filed: Jun. 11, 2019

(65) Prior Publication Data

US 2019/0378686 A1    Dec. 12, 2019

(30) Foreign Application Priority Data

Jun. 12, 2018  (JP) ................................ 2018-111493

(51) Int. Cl.
*H01J 37/28*    (2006.01)
*H01J 37/147*   (2006.01)

(52) U.S. Cl.
CPC .......... *H01J 37/28* (2013.01); *H01J 37/1475* (2013.01)

(58) Field of Classification Search
CPC .. H01J 37/00; H01J 37/02; H01J 37/28; H01J 37/26; H01J 37/261; H01J 37/244
USPC ......................................... 250/306, 307, 311
See application file for complete search history.

(56) References Cited

U.S. PATENT DOCUMENTS

| 4,145,649 A | * | 3/1979 | Pickton | ................... G05F 1/561 |
| | | | | 307/61 |
| 2014/0062321 A1 | * | 3/2014 | McMahon | ............. H05B 45/00 |
| | | | | 315/192 |

FOREIGN PATENT DOCUMENTS

JP     2014-134862 A    7/2014

\* cited by examiner

*Primary Examiner* — Jason L Mccormack
(74) *Attorney, Agent, or Firm* — Miles & Stockbridge, P.C.

(57) ABSTRACT

In a charged particle beam control device, irradiation accuracy of an electron beam can be prevented from deteriorating due to a variation in a ground potential. A current control circuit (1) includes a current conversion unit (4) that supplies a constant current (Id) by adjusting an amount of a current flowing through a current detection resistor (R1) based on a control signal (V1), a differential amplification unit (5) to which a voltage of a first ground side terminal (G1) of the control signal and a voltage of a second ground side terminal (G2) of the current detection resistor (R1) are input, and that outputs an output signal (V3) proportional to a voltage difference between the voltage of the first ground side terminal (G1) and the voltage of the second ground side terminal (G2), and a correction unit (6) to which the output signal (V3) output from the differential amplification unit (5) and the control signal (V1) are input, and that adds the output signal (V3) to the control signal (V1) at a predetermined ratio.

10 Claims, 3 Drawing Sheets

CHARGED PARTICLE BEAM CONTROL DEVICE

TECHNICAL FIELD

The present invention relates to a charged particle beam control device.

BACKGROUND ART

A deflection coil that deflects a charged particle beam by a magnetic field is used in a charged particle beam control device such as a scanning electron microscope for inspecting a dimension of a fine pattern formed on a sample using the charged particle beam. In order to scan the electron beam applied onto the sample, it is necessary to adjust deflection intensity by changing the magnitude and polarity of a current flowing through the deflection coil. In addition, in order to realize highly accurate dimensional inspection, it is necessary to design a constant current circuit having high stability.

A large number of coils are used in the charged particle beam control device, and a deflection amount of the electron beam is controlled for each deflection coil. Therefore, it is necessary to prepare constant current circuits corresponding to the deflection coils.

From a viewpoint of reducing the size and cost of the device, these constant current circuits need to be formed on one substrate. In each constant current circuit, a return current similar to the current flowing through the deflection coil flows through a ground on the substrate, so that a variation in a ground potential is often a problem.

PTL 1 discloses that a constant operation voltage is applied to a load circuit in order to prevent the variation in the ground potential.

CITATION LIST

Patent Literature

PTL 1: JP-A-2014-134862

SUMMARY OF INVENTION

Technical Problem

In the charged particle beam control device, a relationship between a control signal and an output current in the constant current circuit varies due to the variation in the ground potential. As a result, the current flowing through the deflection coil changes even when the control signal is constant, and irradiation accuracy of an electron beam to a sample is deteriorated.

PTL 1 describes a problem of the variation in the ground potential. However, the problem specific to the charged particle beam control device that the irradiation accuracy of the electron beam is deteriorated due to the variation in the ground potential and a solution thereof are not mentioned.

An object of the invention is to prevent the irradiation accuracy of the electron beam from deteriorating due to the variation in the ground potential in the charged particle beam control device.

Solution to Problem

A charged particle beam control device according to an aspect of the invention includes a constant current source including a current control circuit that supplies a current to a load based on a control signal for setting an amount of the current to be applied to the load, and converts reflected electrons generated by irradiating a sample with a charged particle beam into an electrical signal and processes the electrical signal. The current control circuit includes: a current conversion unit that supplies a constant current by adjusting an amount of a current flowing through a current detection resistor based on the control signal; a differential amplification unit to which a voltage of a first ground side terminal of the control signal and a voltage of a second ground side terminal of the current detection resistor are input, and that outputs an output signal proportional to a voltage difference between the voltage of the first ground side terminal and the voltage of the second ground side terminal; and a correction unit to which the output signal output from the differential amplification unit and the control signal are input, and that adds the output signal to the control signal at a predetermined ratio.

A charged particle beam control device according to an aspect of the invention includes a constant current source that supplies a current to a load based on a control signal for setting an amount of the current to be applied to the load, and converts reflected electrons generated by irradiating a sample with a charged particle beam into an electrical signal and processes the electrical signal. The constant current source includes: a control signal input unit to which the control signal is supplied and that includes a first ground side terminal serving as a voltage reference of the control signal; and a current control circuit that supplies the current to the load based on the control signal from the control signal input unit. The current control circuit includes: a voltage drive transistor that includes a drive terminal, a first terminal and a second terminal and causes a constant current to flow between the first terminal and the second terminal by supplying a drive voltage to the drive terminal; a current detection resistor that is connected between a second ground side terminal and a second load terminal of the load, a first load terminal of the load being connected to the second terminal of the voltage drive transistor; an operational amplifier that supplies the drive voltage to the drive terminal of the voltage drive transistor; and a differential amplification unit to which a voltage of the first ground side terminal and a voltage of the second ground side terminal are input, and that outputs a voltage proportional to a voltage difference between the voltage of the first ground side terminal and the voltage of the second ground side terminal to an output terminal. A first terminal of a first resistor is connected to the control signal input unit, a first terminal of a second resistor is connected to the output terminal of the differential amplification unit, second terminals of the first resistor and the second resistor are connected to each other, the second terminal of the first resistor is connected to an inversion input terminal of the operational amplifier, and a third resistor is connected between the inversion input terminal of the operational amplifier and the second load terminal of the load.

A charged particle beam control device according to an aspect of the invention includes a constant current source that supplies a current to a load based on a control signal for setting an amount of the current to be applied to the load, and converts reflected electrons generated by irradiating a sample with a charged particle beam into an electrical signal and processes the electrical signal. The constant current source includes: a control signal input unit to which the control signal is supplied and that includes a first ground side terminal serving as a voltage reference of the control signal;

and a current control circuit that supplies the current to the load based on the control signal from the control signal input unit. The current control circuit includes: a voltage drive transistor that includes a drive terminal, a first terminal and a second terminal and causes a constant current to flow between the first terminal and the second terminal by supplying a drive voltage to the drive terminal; a current detection resistor that is connected between a second ground side terminal and a second load terminal of the load, a first load terminal of the load being connected to the second terminal of the voltage drive transistor; a first operational amplifier that supplies the drive voltage to the drive terminal of the voltage drive transistor; and a differential amplification unit to which a voltage of the first ground side terminal and a voltage of the second ground side terminal are input, and that outputs a voltage proportional to a voltage difference between the voltage of the first ground side terminal and the voltage of the second ground side terminal to an output terminal. A first terminal of a first resistor is connected to the control signal input unit, a first terminal of a second resistor is connected to the output terminal of the differential amplification unit, second terminals of the first resistor and the second resistor are connected to each other, the second terminal of the first resistor is connected to an inversion input terminal of a second operational amplifier, a third resistor is connected between the inversion input terminal of the second operational amplifier and an output terminal of the second operational amplifier, the output terminal of the second operational amplifier is connected to a non-inversion input terminal of the first operational amplifier, a non-inversion input terminal of the second operational amplifier is connected to the first ground side terminal, and an inversion input terminal of the first operational amplifier is connected to the second load terminal of the load.

Advantageous Effect of Invention

According to an aspect of the invention, in the charged particle beam control device, the irradiation accuracy of the electron beam can be prevented from deteriorating due to the variation in the ground potential.

DESCRIPTION OF EMBODIMENTS

Hereinafter, embodiments will be described with reference to the drawings.

First Embodiment

A configuration of a charged particle beam control device will be described with reference to FIG. 1.

Figure 1:
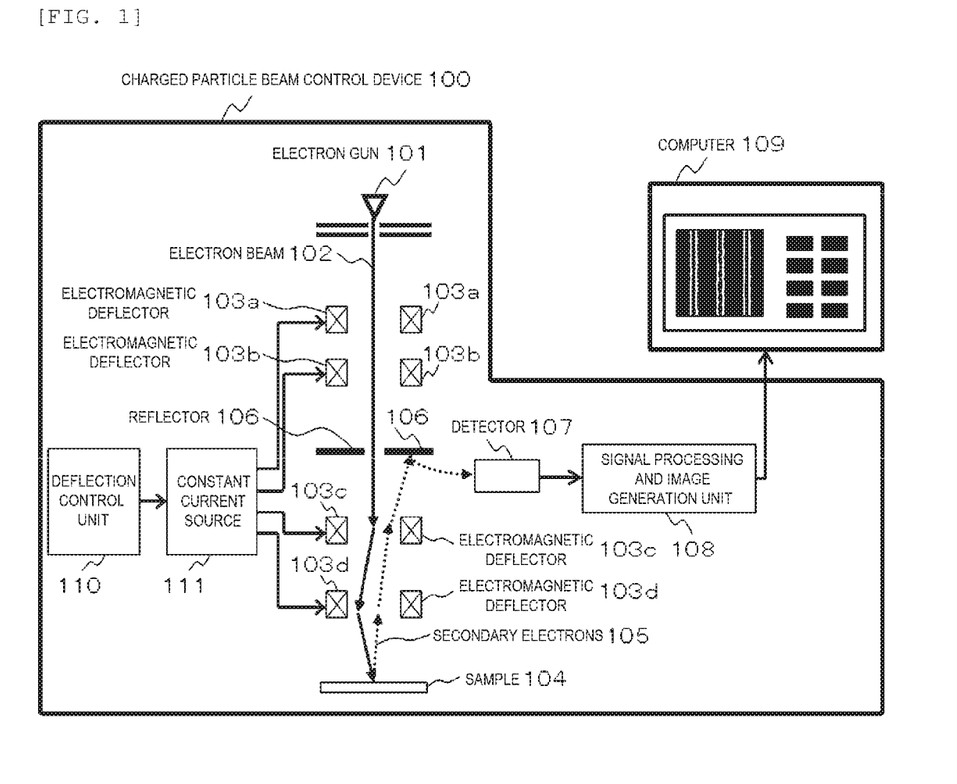
FIG. 1 is a diagram showing a configuration of a charged particle beam control device.

As shown in FIG. 1, a charged particle beam control device 100 includes an electron gun 101 that performs irradiation with an electron beam (a charged particle beam) 102, electromagnetic deflectors 103a to 103d that deflect the electron beam 102 to scan a surface of a sample 104 and control an orbit of secondary electrons 105, a reflector 106 that reflects the secondary electrons 105 and the like generated from the sample 104, a detector 107 that captures tertiary electrons generated from the reflector 106 and converts the tertiary electrons into an electrical signal, and a signal processing and image generation unit 108 that processes the detected electrical signal and generates image information of the sample.

The image information generated by the signal processing and image generation unit 108 is supplied to a computer 109 and displayed on a screen of the computer 109 as a sample observation image. In addition, the charged particle beam control device 100 includes a deflection control unit 110 and a constant current source 111, and adjusts an amount of a current applied to the electromagnetic deflectors 103a to 103d. The deflection control unit 110 supplies a control signal for setting the amount of the current applied to the electromagnetic deflectors 103a to 103d to the constant current source 111. The constant current source 111 receives the control signal and outputs the current to the electromagnetic deflectors 103a to 103d.

Although FIG. 1 shows four types of electromagnetic deflectors 103a to 103d, the invention is not limited thereto, and more electromagnetic deflectors may be provided.

An internal configuration of the constant current source 111 in FIG. 1 will be described with reference to FIG. 3.

Figure 3:
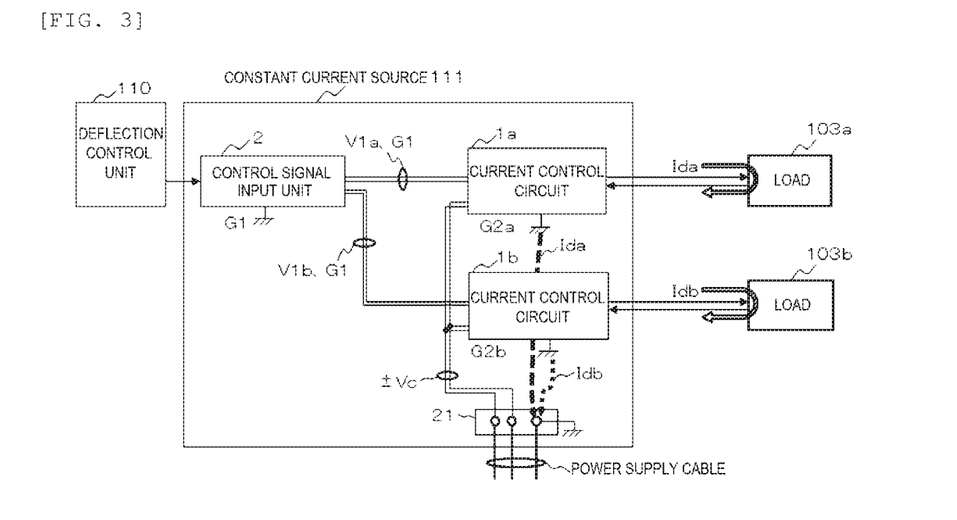
FIG. 3 is a schematic view showing an example of a substrate layout.

As shown in FIG. 3, the constant current source 111 includes a control signal input unit 2 that receives the control signal from the deflection control unit 110, current control circuits 1a and 1b, and a power supply interface 21. Loads 103a and 103b refer to the electromagnetic deflectors 103a and 103b in FIG. 1. Here, current control circuits 1c and 1d corresponding to the electromagnetic deflectors 103c and 103d are omitted.

A configuration of the current control circuit 1 of the charged particle beam control device 100 according to a first embodiment will be described with reference to FIG. 2.

Figure 2:
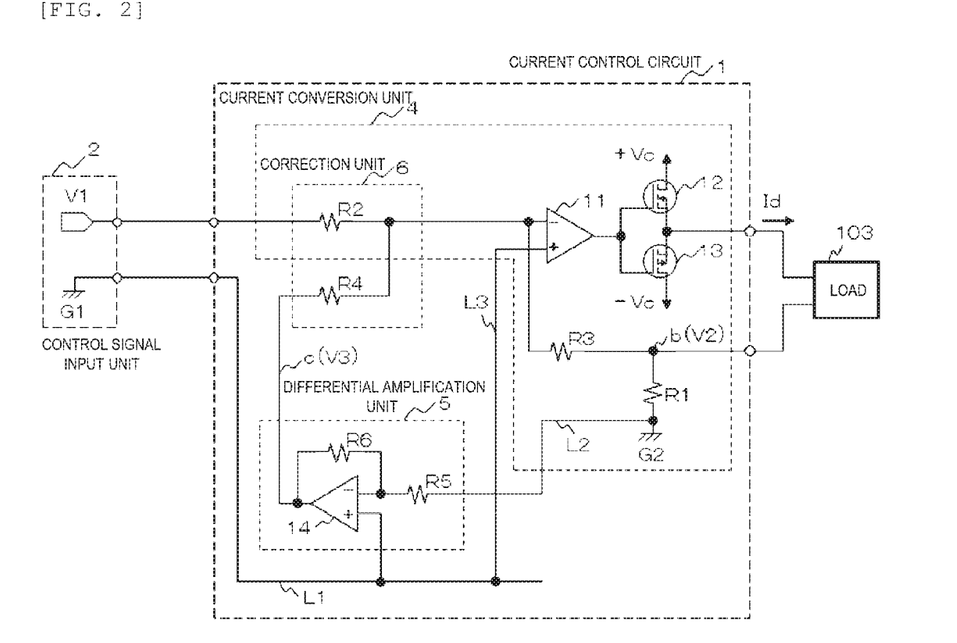
FIG. 2 is a circuit diagram showing an example of a configuration of a current control circuit according to a first embodiment.

As shown in FIG. 2, the current control circuit 1 drives the load 103 by flowing a current Id, corresponding to a control signal V1 supplied from the control signal input unit 2, to the load 103. The current control circuit 1 includes a current conversion unit 4, a differential amplification unit 5 and a correction unit 6. A resistor R2 is included in components of both the current conversion unit 4 and the correction unit 6.

The current control circuit 1 detects a potential difference between a ground potential G1 of the control signal input unit 2 and a ground potential G2 of a resistor R1 in the differential amplification unit 5, and adds the detected potential difference to the current conversion unit 4 via the correction unit 6. Accordingly, the current Id can be stabilized even when the ground potential G2 varies with respect to the ground potential G1.

The current conversion unit 4 includes resistors R1, R2 and R3, an operational amplifier 11, an NMOS transistor 12 and a PMOS transistor 13. The control signal V1 supplied from the control signal input unit 2 is input to the current conversion unit 4, and the current Id corresponding to the control signal V1 is supplied to the load 103, and the current flowing to the load 103 is pulled back to the current conversion unit 4 to cause the current to flow to the ground G2 via the resistor R1.

Here, the resistor R2 is connected between an output terminal of the control signal input unit 2 for the control signal V1 and an inversion input terminal of the operational amplifier 11. The resistor R3 is connected between the inversion input terminal of the operational amplifier 11 and the load 103. The resistor R1 is connected between the ground G2 and a connection point b of the resistor R3 and the load 103. A voltage same as that of the ground G1 of the control signal V1 is input to a non-inversion input terminal of the operational amplifier 11. An output terminal of the operational amplifier 11 is connected to gate terminals of the NMOS transistor 12 and the PMOS transistor 13.

The NMOS transistor 12 and the PMOS transistor 13 have drain terminals respectively connected to a positive voltage (+Vc) and a negative voltage (−Vc), and source terminals connected to each other. In addition, the source terminals are connected to one end of the load 103, and the other end of the load 103 is connected to the connection point b.

When the control signal V1 having the ground potential G1 as a reference ground is input to the current conversion unit 4, a voltage V2 at the point b is given by an equation (1) by an inversion amplification circuit including the operational amplifier 11 and the resistors R2 and R3.

$$V2=-V1\times(R3/R2) \qquad \text{Equation (1)}$$

The current Id flowing through the load 103 is equal to a current flowing through the resistor R1, and is given by an equation (2) using the resistor R1 and both end voltages V2 and G2 of the resistor R1.

$$Id=(V2-G2)/R1=-V1\times\{R3/(R2\times R1)\}-G2/R1 \qquad \text{Equation (2)}$$

Here, when the ground potential G1 of the control signal V1 and the potential G2 of the resistor R1 on a ground side are common, G2=0 is substituted in the equation (2) to obtain an equation (3).

$$Id=-V1\times\{R3/(R2\times R1)\} \qquad \text{Equation (3)}$$

A current error of the current Id generated by the potential difference between the ground G1 and the ground G2 is −G2/R1 by subtracting the equation (3) from the equation (2).

Next, a circuit configuration and operation of the differential amplification unit 5 will be described.

The differential amplification unit 5 includes a resistor R5, a resistor R6 and an operational amplifier 14. A voltage of the ground G1 of the control signal input unit 2 and a voltage of the ground G2 of the resistor R1 are input to the differential amplification unit 5. The potential difference between the ground G1 and the ground G2 (the voltage of the ground G2 with respect to that of the ground G1) is multiplied (inverted) by −1 and a result is output to a point c.

Here, the resistor R5 is connected between a wiring L2 for detecting the voltage of the ground G2 and an inversion input terminal of the operational amplifier 14. The resistor R6 is connected between the inversion input terminal and an output terminal of the operational amplifier 14. In addition, a wiring L1 for detecting the voltage of the ground G1 of the control signal input unit 2 is connected to a non-inversion input terminal of the operational amplifier 14.

In addition, the dedicated wiring L1 is preferably used to connect such that a voltage of the non-inversion input terminal of the operational amplifier 14 is identical with the voltage of the ground G1 to avoid a potential difference in the wiring L1. Similarly, the resistor R5 and the ground G2 are preferably connected by the wiring L2 such that no potential difference is generated at both ends of the wiring L2. Further, the wiring L2 is preferably wired such that the voltage of the ground G2 close to a ground side terminal of the resistor R1 can be obtained on a circuit board.

The differential amplification unit 5 forms an inversion amplification circuit by causing resistance values of the resistor R5 and the resistor R6 to be identical with each other. An output signal V3 at a terminal c is expressed by the following equation (4) based on the voltage of the ground G1.

$$V3=-G2\times(R6/R5)=-G2 \qquad \text{Equation (4)}$$

Next, a circuit configuration and operation of the correction unit 6 will be described. The correction unit 6 includes the resistor R2 and a resistor R4. The control signal V1 and the output signal V3 of the differential amplification unit 5 are input to the correction unit 6, and are connected via the resistor R2 and the resistor R4 respectively. The control signal V1 and the output signal V3 are input to the inversion input terminal of the operational amplifier 11. Here, R4 has a resistance value same as that of R3.

When the control signal V1 having the ground potential G1 as a reference ground and the output signal V3 of the differential amplification unit 5 are input to the current conversion unit 4, the voltage V2 at the point b is given by an addition circuit including the operational amplifier 11 and the resistors R2, R3, and R4.

$$V2=-R3\times(V1/R2+V3/R4)=-R3\times(V1/R2-G2/R3)=-V1\times(R3/R2)+G2 \qquad \text{Equation (5)}$$

The current Id flowing through the load 103 is equal to the current flowing through the resistor R1, and is given by the following equation using the resistor R1 and both end voltages V2 and G2 of the resistor R1.

$$Id=(V2-G2)/R1=-V1\times\{R3/(R2\times R1)\} \qquad \text{Equation (6)}$$

The equation (6) is identical with the equation (3). That is, regardless of the voltage of the ground G2, the current Id can be uniquely determined by the resistance values of the resistors R1, R2 and R3 with respect to the control signal V1.

Positive and negative power supply voltages (not shown) are applied to the operational amplifiers 11 and 14, and both operational amplifiers can output the positive and negative voltages. When a current is discharged to the load 103 (source), the operational amplifier 11 drives the NMOS transistor 12 with a positive voltage. When the current is absorbed from the load 103 (sink), the operational amplifier 11 drives the PMOS transistor 13 with a negative voltage. Accordingly, by controlling a voltage value of the control signal V1 to include positive and negative polarities, a source current source and a sink current source can be operated with respect to the load 103.

Next, an example of a substrate layout in a case where a plurality of current control circuits 1 are used on one substrate will be described with reference to FIG. 3. Although FIG. 3 shows the configuration in which two current control circuits 1 are arranged, three or more current control circuits 1 may be arranged.

As shown in FIG. 3, the constant current source 111 includes the control signal input unit 2, the current control circuits 1a and 1b, the loads 103a and 3b, and the power supply interface 21 for supplying power supply voltages +Vc and −Vc of the NMOS transistor 12 and the PMOS transistor 13 of the current control circuits 1a and 1b.

The constant current source 111 generates control signals V1a and V1b based on the voltage of the ground G1 in the control signal input unit 2, and outputs the control signals V1a and V1b to the current control circuits 1a and 1b respectively. The control signal input unit 2 may function as a buffer circuit to which analog voltages V1a and V1b supplied from an outside of the constant current source 111 are input and that supplies the analog voltages V1a and V1b to the current control circuits 1a and 1b respectively.

Alternatively, the control signal input unit 2 may include a DAC circuit. Digital signals supplied from the outside of the constant current source 111 are input to the DAC circuit, and analog signals corresponding to digital values set in the DAC circuit are output as the control signals V1a and V1b.

The control signal input unit 2 wires the voltage of the ground G1 of the control signal input unit 2 to the current control circuits 1a and 1b, together with the control signals V1a and V1b. Preferably, a wiring width is large and a wiring conductor is thick enough in order to provide the same voltage of the ground G1 to the current control circuits 1a and 1b.

The control signal V1a is input to the current control circuit 1a, and a corresponding current Ida is supplied to the load 103a. The control signal V1b is input to the current control circuit 1b, and a corresponding current Idb is supplied to the load 103b. The current control circuits 1a and 1b return the currents flowing through the loads 103a and 103b respectively. The returned currents flow to the power supply interface 21 via a common ground of the constant current source 111 and then to an externally connected power supply circuit via a power supply cable.

In FIG. 3, the current Ida indicated by a broken line is a current path that flows through the common ground and that is output from the current control circuit 1a. A voltage of a ground G2a of the resistor R1 in FIG. 2 has a voltage value different from that of the ground G1 due to an IR drop generated by the flowing of the current Ida.

Similarly, the current Idb indicated by a broken line is a current path that flows through the common ground and that is output from the current control circuit 1b. A voltage of a ground G2b of the resistor R2 has a voltage value different from that of the ground G1 due to an IR drop generated by the flowing of the current Ida and the current Idb.

In the constant current source 111, the voltage of the ground G1 is not affected by the IR drop due to the flowing of the currents Ida and Idb, and a stable voltage is obtained. Therefore, a layout is preferably obtained in which the control signal input unit 2 is arranged at a position different from the paths through which the currents Ida and Idb on the common ground flow.

When the control signal input unit 2 and the current control circuit 1a or 1b have to be arranged close to each other due to the limitation of the substrate layout, a slit that divides the common ground between the control signal input unit 2 and the current control circuit 1a or 1b is preferably inserted, such that the current Ida or Idb does not flow through the control signal input unit 2 as much as possible. Alternatively, a similar effect can also be obtained by forming the ground G1 of the control signal input unit 2 and the grounds G2a and G2b in different layers and connecting two grounds by a via or the like.

The first embodiment provides the charged particle beam control device 100 that includes the constant current source 111 including the current control circuit 1 supplying a current to the load 103 based on the control signal V1 for setting the amount of the current to be applied to the load 103, and that converts reflected electrons generated by irradiating the sample 104 with the charged particle beam 102 into an electrical signal and processes the electrical signal.

The current control circuit 1 includes: the current conversion unit 4 that supplies the constant current Id by adjusting the amount of the current flowing through the current detection resistor R1 based on the control signal V1; the differential amplification unit 5 to which the voltage of the first ground side terminal G1 of the control signal V1 and the voltage of the second ground side terminal G2 of the current detection resistor R1 are input, and that outputs the output signal V3 proportional to the voltage difference between the voltage of the first ground side terminal G1 and the voltage of the second ground side terminal G2; and the correction unit 6 to which the output signal V3 output from the differential amplification unit 5 and the control signal V1 are input, and that adds the output signal V3 to the control signal V1 at a predetermined ratio.

The charged particle beam control device 100 further includes the deflection control unit 110 that generates the control signal V1 for setting the amount of the current to be applied to the electromagnetic deflector 103 as the load. The constant current source 111 further includes the control signal input unit 2 to which the control signal V1 from the deflection control unit 110 is input. The current control circuit 1 supplies the current to the electromagnetic deflector 103 based on the control signal V1 from the control signal input unit 2.

The current conversion unit 4 further includes the operational amplifier 11. The correction unit 6 adds the output signal V3 to the control signal V1 at the predetermined ratio using addition circuits (11, R2, R3 and R4) of the operational amplifier 11.

More specifically, the current control circuit 1 according to the first embodiment includes: the voltage drive transistor 12 that includes a drive terminal (gate terminal), a first terminal (12 +Vc side) and a second terminal (12 load side) and causes the constant current Id to flow between the first terminal (12 +Vc side) and the second terminal (12 load side) by supplying a drive voltage (11 output voltage) to the drive terminal (12 gate terminal, that is, a terminal to which 11 output is connected); a current detection resistor R1 that is connected between the second ground side terminal G2 and a second load terminal (b) of the load 103, a first load terminal (12 side) of the load 103 being connected to the second terminal of the voltage drive transistor 12; an operational amplifier 11 that supplies the drive voltage to the drive terminal of the voltage drive transistor 12; and the differential amplification unit 5 to which the voltage of the first ground side terminal G1 and the voltage of the voltage of the second ground side terminal G2 are input, and that outputs the voltage V3 proportional to the voltage difference between the voltage of the first ground side terminal G1 and the voltage of the second ground side terminal G2 to an output terminal (c).

A first terminal (2 side) of the first resistor R2 is connected to the control signal input unit 2. A first terminal (5 side) of the second resistor R4 is connected to the output terminal of the differential amplification unit 5. Second terminals (11 inversion input terminal side) of the first resistor R2 and the second resistor R4 are connected to each other, and the second terminal of the first resistor R2 is connected to the inversion input terminal of the operational amplifier 11. The third resistor R3 is connected between the inversion input terminal of the operational amplifier 11 and the second load terminal of the load 103.

The non-inversion input terminal of the operational amplifier 11 is connected to the first ground side terminal G1. The differential amplification unit 5 inverts the voltage difference between the voltage of the first ground side terminal G1 and the voltage of the second ground side terminal G2 by −1, and outputs a result to the output terminal (c). The second resistor R4 has a resistance value same as that of the third resistor R3.

In the first embodiment, even when the voltage of the ground G2 of the resistor R1 in the current control circuit 1 has a difference with respect to the voltage of the ground G1 of the control signal, particularly due to the returned current from the load flowing through the common ground on the substrate, a highly stable constant current can be supplied to the load 103 by the configuration of the current control circuit 1 to which the differential amplification unit 5 and the correction unit 6 are added. Accordingly, an irradiation position of the electron beam 102 to the sample 104 can be controlled with high accuracy, and a sample image having high resolution can be generated.

Second Embodiment

Figure 4:
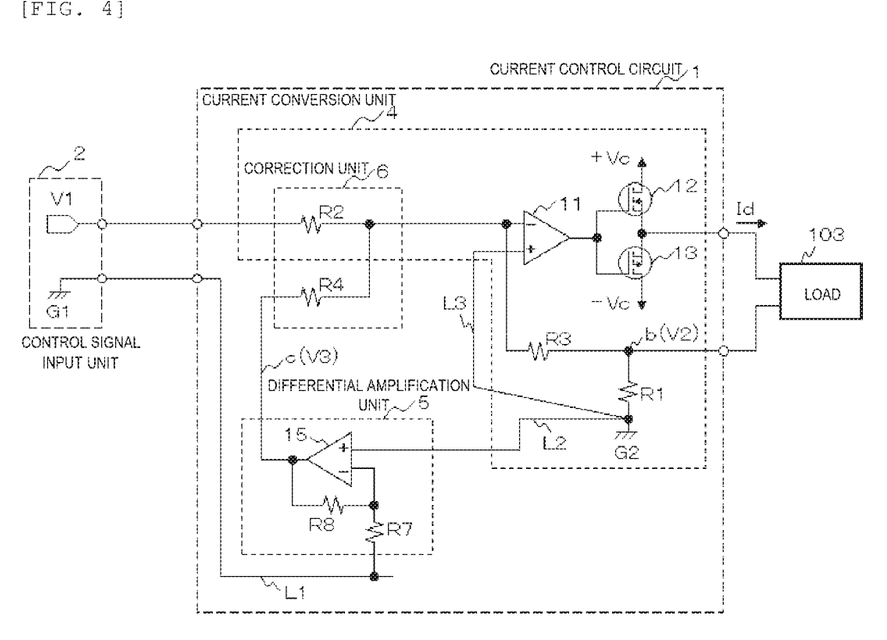
FIG. 4 is a circuit diagram showing an example of a configuration of a current control circuit according to a second embodiment.

A configuration of the current control circuit 1 of the charged particle beam control device 100 according to a second embodiment will be described with reference to FIG. 4.

Similar to the first embodiment, the current control circuit 1 according to the second embodiment includes the current conversion unit 4, the differential amplification unit 5 and the correction unit 6. The second embodiment is different from the first embodiment in that a non-inversion input terminal of the operational amplifier 11 is connected to a ground side terminal of the resistor R1 in the current conversion unit 4, and the differential amplification unit 5 includes resistors R7 and R8 and an operational amplifier 15. Other parts of the configuration are the same as those of the current control circuit 1 according to the first embodiment.

When the control signal V1 having the ground potential G1 as a reference ground is input to the current conversion unit 4, the voltage V2 at the point b is given by an equation (7) by an inversion amplification circuit including the operational amplifier 11 and the resistors R2 and R3.

$$V2=-V1\times(R3/R2)+G2\times(R2+R3)/R2 \qquad \text{Equation (7)}$$

The current Id flowing through the load 103 is equal to a current flowing through the resistor R1, and is given by an equation (8) using the resistor R1 and both end voltages V2 and G2 of the resistor R1.

$$Id=(V2-G2)/R1=-(V1-G2)\times\{R3/(R2\times R1)\} \qquad \text{Equation (8)}$$

Here, when a voltage of the ground G1 of the control signal V1 and a voltage of the ground G2 of the resistor R1 are common, G2=0 is substituted in the equation (8) to obtain an equation (9).

$$Id=-V1\times\{R3/(R2\times R1)\} \qquad \text{Equation (9)}$$

A current error of the current Ida generated by a potential difference between the ground G1 and the ground G2 is $G2\times\{R3/(R2\times R1)\}$ by subtracting the equation (9) from the equation (8).

Next, a circuit configuration and operation of the differential amplification unit 5 will be described.

The voltage of the ground G1 of the control signal V1 and the voltage of the ground G2 of the resistor R1 are input to the differential amplification unit 5, the potential difference between the ground G1 and the ground G2 (the voltage of the ground G2 with respect to that of the ground G1) is doubled and a result is output to the point c.

Here, the ground side terminal of the resistor R1 is connected to a non-inversion input terminal of the operational amplifier 15 by the wiring L2. The resistor R7 is connected between the wiring L1 to which the voltage of the ground G1 of the control signal input unit 2 is supplied and an inversion input terminal of the operational amplifier 15. The resistor R8 is connected between the inversion input terminal of the operational amplifier 15 and an output terminal of the operational amplifier 15. The wiring L2 preferably has a large wiring width to avoid a potential variation due to the IR drop such that a voltage of the non-inversion input terminal of the operational amplifier 15 is identical with the voltage of the ground G2. Similarly, the wiring L1 preferably has a large wiring width to avoid the IR drop in the wiring L1 such that the voltage of the ground G1 is supplied to the resistor R7.

In the differential amplifier 5, the resistors R7 and R8 have the same resistance value to form a non-inversion amplification circuit, and whereby the output signal V3 at the point c is expressed by the following equation (9) based on the voltage of the ground G1.

$$V3=G2\times(1+R8/R7)=2\times G2 \qquad \text{Equation (9)}$$

Next, a circuit configuration and operation of the correction unit 6 will be described. The control signal V1 and the output signal V3 of the differential amplification unit 5 are input to the correction unit 6, and are connected via the resistor R2 and the resistor R4 respectively. The control signal V1 and the output signal V3 are supplied to the inversion input terminal of the operational amplifier 11. Here, R4 uses a resistance value same as that of R2.

When the control signal V1 having the ground potential G1 as a reference ground and the output signal V3 of the differential amplification unit 5 are input to the current conversion unit 4, the voltage V2 at the point b is given by an equation (10) by an addition circuit including the operational amplifier 11 and the resistors R2, R3 and R4.

$$V2=-V1\times(R3/R2)+G2\times(1+R3/R2-R3/R4)=-V1\times(R3/R2)+G2 \qquad \text{Equation (10)}$$

The current Id flowing through the load 103 is equal to the current flowing through the resistor R1, and is given by an equation (11) using the resistor R1 and both end voltages V2 and G2 of the resistor R1.

$$Id=(V2-G2)/R1=-V1\times\{R3/(R2\times R1)\} \qquad \text{Equation (11)}$$

The equation (11) is identical with the equation (9). That is, regardless of the voltage of the ground G2, the current Id can be uniquely determined by the resistance values of the resistors R1, R2 and R3 with respect to the control signal V1.

Positive and negative power supply voltages (not shown) are applied to the operational amplifiers 11 and 15, and both operational amplifiers can output the positive and negative voltages. When a current is discharged to the load 103 (source), the operational amplifier 11 drives the NMOS transistor 12 with a positive voltage. When the current is absorbed (sink), the operational amplifier 11 drives the PMOS transistor 13 with a negative voltage. An arbitrary current can be supplied to the load 103 by controlling the magnitude and polarity of the voltage of the control signal V1.

In the second embodiment, the non-inversion input terminal of the operational amplifier 11 is connected to the second ground side terminal G2. The differential amplification unit 5 doubles the voltage difference between the voltage of the first ground side terminal G1 and the voltage of the second ground side terminal G2, and outputs a result to the output terminal (c). The second resistor R4 has a resistance same as that of the first resistor R2.

In the second embodiment, when the operational amplifier 11 and the resistor R1 are arranged close to each other in a substrate layout, the non-inversion input terminal of the operational amplifier 11 is close to the ground side terminal of the resistor R1, so that the effect of facilitating an wiring layout of the substrate is obtained.

Third Embodiment

Figure 5:
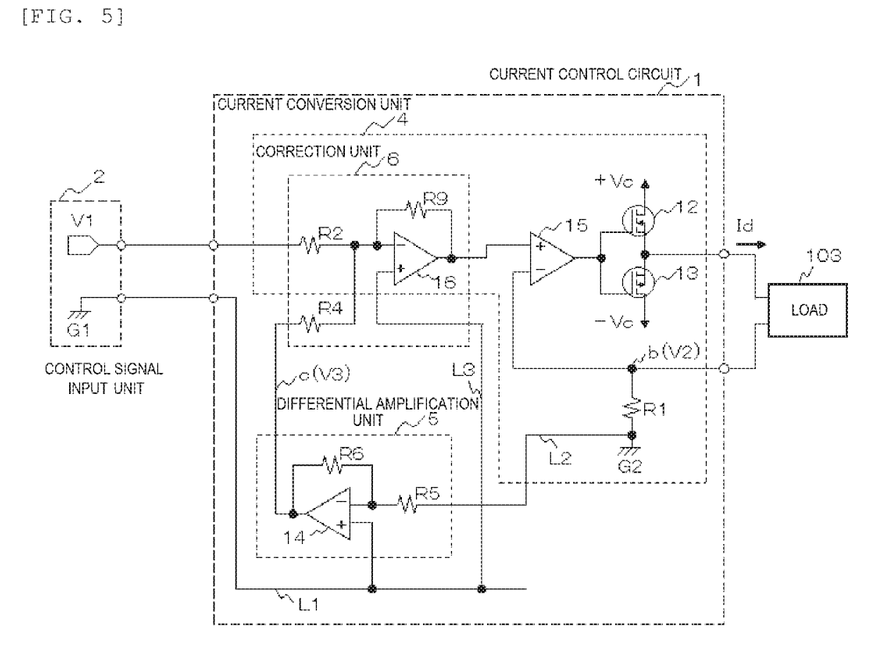
FIG. 5 is a circuit diagram showing an example of a configuration of a current control circuit according to a third embodiment.

A configuration of the current control circuit 1 of the charged particle beam control device 100 according to a third embodiment will be described with reference to FIG. 5.

Similar to the first and second embodiments, the current control circuit 1 according to the third embodiment includes the current conversion unit 4, the differential amplification unit 5 and the correction unit 6.

The current conversion unit 4 includes resistors R1, R2 and R9, operational amplifiers 15 and 16, the NMOS transistor 12 and the PMOS transistor 13. The control signal V1 supplied from the control signal input unit 2 is input to the current conversion unit 4, the current Id corresponding to the control signal V1 is supplied to the load 103, and the current flowing to the load 103 is pulled back to the current conversion unit 4 to cause the current to flow to the ground G2 via the resistor R1.

Here, the resistor R2 is connected between an output terminal of the control signal V1 of the control signal input unit 2 and an inversion input terminal of the operational amplifier 16. The resistor R9 is connected between the inversion input terminal of the operational amplifier 16 and an output terminal of the operational amplifier 16. A voltage same as that of the ground G1 of the control signal input unit 2 is input to a non-inversion input terminal of the operational amplifier 16. The output terminal of the operational amplifier 16 is connected to a non-inversion input terminal of the operational amplifier 15. The inversion input terminal of the operational amplifier 15 is connected to the load 103.

The resistor R1 is connected between the ground G2 and the connection point b of the inversion input terminal of the operational amplifier 15 and the load 103. The output terminal of the operational amplifier 15 is connected to gate terminals of the NMOS transistor 12 and the PMOS transistor 13. The NMOS transistor 12 and the PMOS transistor 13 have drain terminals respectively connected to a positive voltage (+Vc) and a negative voltage (−Vc), and source terminals connected to each other. The source terminals of both transistors are connected to one end of the load 103, and the other end of the load 103 is connected to the point b.

When the control signal V1 having the ground potential G1 as a reference ground is input to the current conversion unit 4, the voltage V2 at the point b is given by an equation (12) by an inversion amplification circuit including the operational amplifier 16 and the resistors R2 and R9 as well as a non-inversion amplification circuit including the operational amplifier 15.

$$V2=-V1\times(R9/R2) \qquad \text{Equation (12)}$$

The current Id flowing through the load 103 is equal to a current flowing through the resistor R1, and is given by an equation (13) using the resistor R1 and both end voltages V2 and G2 of the resistor R1.

$$Id=(V2-G2)/R1=-V1\times\{R9/(R2\times R1)\}-G2/R1 \qquad \text{Equation (13)}$$

Here, when a voltage of the ground G1 of the control signal V1 and a voltage of the ground G2 of the resistor R1 are common, G2=0 is substituted in the equation (13) to obtain an equation (14).

$$Id=-V1\times\{R9/(R2\times R1)\} \qquad \text{Equation (14)}$$

A current error of the current Id generated by a potential difference between the ground G1 and the ground G2 is −G2/R1 by subtracting the equation (14) from the equation (13).

Next, a circuit configuration and operation of the differential amplification unit 5 will be described.

The differential amplification unit 5 has a configuration same as that of the first embodiment of the invention, and includes the resistors R5 and R6 and the operational amplifier 14. The voltage of the ground G1 of the control signal input unit 2 and the voltage of the ground G2 of the resistor R1 are input to the differential amplification unit 5. The potential difference between the ground G1 and the ground G2 (the voltage of the ground G2 with respect to that of the ground G1) is multiplied (inverted) by −1 and a result is output to the point c.

Here, the resistor R5 is connected between the wiring L2 that detects the voltage of the ground side terminal (the ground G2) of the resistor R1 and the inversion input terminal of the operational amplifier 14. The resistor R6 is connected between the inversion input terminal of the operational amplifier 14 and the output terminal of the operational amplifier 14. The voltage of the ground G1 of the control signal input unit 2 is supplied to the non-inversion input terminal of the operational amplifier 14 via the wiring L1.

In the differential amplifier 5, the resistors R5 and R6 have the same resistance value to form an inversion amplification circuit, and the output signal V3 is expressed by a following equation (15) based on the voltage of the ground G1.

$$V3=-G2\times(R6/R5)=-G2 \qquad \text{Equation (15)}$$

Next, a circuit configuration and operation of the correction unit 6 will be described.

The correction unit 6 includes part of components of the current conversion unit 4, and includes the resistors R2, R4 and R9 and the operational amplifier 16. The control signal V1 and the output signal V3 of the differential amplification unit 5 are input to the correction unit 6, and are connected via the resistor R2 and the resistor R4 respectively. The control signal V1 and the output signal V3 are supplied to the inversion input terminal of the operational amplifier 16.

When the control signal V1 having the ground potential G1 as a reference ground and the output signal V3 of the differential amplification unit 5 are input to the current conversion unit 4, the voltage V2 at the point b is given by an equation (16) by an addition circuit including the operational amplifier 16 and the resistors R2, R4 and R9 as well as a non-inversion amplification circuit including the operational amplifier 15.

$$V2=-R9\times(V1/R2+V3/R4)=-R9\times(V1/R2-G2/R4)=-V1\times(R9/R2)+G2\times(R9/R4) \qquad \text{Equation (16)}$$

The current Id flowing through the load 103 is equal to the current flowing through the resistor R1, and is given by an equation (17) using the resistor R1 and both end voltages V2 and G2 of the resistor R1.

$$Id=(V2-G2)/R1=-V1\times\{R9/(R2\times R1)\}+G2\times(R9/R4-1)/R4 \qquad \text{Equation (17)}$$

Here, the resistors R4 and R9 are assumed to have resistance values same as that of the resistor R2, and whereby the equation (17) can be expressed by the following equation (18).

$$Id = -V1/R1 \qquad \text{Equation (18)}$$

The equation (18) indicates that a relationship between the control signal V1 and the current Id can be expressed only by the resistor R1, and the current Id can be determined with respect to the control signal V1 regardless of the voltage of the ground G2 of the resistor R1.

Positive and negative power supply voltages (not shown) are applied to the operational amplifiers 14, 15 and 16, and the operational amplifiers can output the positive and negative voltages. When a current is discharged to the load (source), the operational amplifier 15 drives the NMOS transistor 12 with a positive voltage. When the current is absorbed (sink), the operational amplifier 15 drives the PMOS transistor 13 with a negative voltage. An arbitrary current can be supplied to the load by controlling the magnitude and polarity of the voltage of the control signal V1.

The third embodiment provides the charged particle beam control device 100 that includes the constant current source 111 that supplies a current to the load 103 based on a control signal V1 for setting the amount of the current to be applied to the load 103, and that converts reflected electrons generated by irradiating the sample 104 with the charged particle beam 102 into an electrical signal and processes the electrical signal.

The constant current source 111 includes: the control signal input unit 2 to which the control signal V1 is supplied and that includes the first ground side terminal G1 serving as a voltage reference of the control signal V1; and the current control circuit 1 that supplies the current to the load 103 based on the control signal from the control signal input unit 2.

The current control circuit 1 includes: the voltage drive transistor 12 that includes the drive terminal (gate terminal), the first terminal (12 +Vc side) and the second terminal (12 load side) and causes the constant current Id to flow between the first terminal (12 +Vc side) and the second terminal (12 load side) by supplying the drive voltage (11 output voltage) to the drive terminal (12 gate terminal, that is, a terminal to which 11 output is connected); the current detection resistor R1 that is connected between the second ground side terminal G2 and the second load terminal (b) of the load, the first load terminal (12 side) of the load 103 being connected to the second terminal of the voltage drive transistor 12; the first operational amplifier 15 that supplies the drive voltage to the drive terminal of the voltage drive transistor 12; and the differential amplification unit 5 to which the voltage of the first ground side terminal G1 and the voltage of the second ground side terminal G2 are input, and that outputs the voltage V3 proportional to a voltage difference between the voltage of the first ground side terminal G1 and the voltage of the second ground side terminal G2 to the output terminal (c).

The first terminal (2 side) of the first resistor R2 is connected to the control signal input unit 2. The first terminal (5 side) of the second resistor R4 is connected to the output terminal of the differential amplification unit 5. Second terminals (16 inversion input terminal side) of the first resistor R2 and the second resistor R4 are connected to each other, and the second terminal of the first resistor R2 is connected to the inversion input terminal of the second operational amplifier 16. The third resistor R9 is connected between the inversion input terminal of the second operational amplifier 16 and the output terminal of the second operational amplifier 15. The output terminal of the second operational amplifier 16 and the non-inversion input terminal of the first operational amplifier 15 are connected. The non-inversion input terminal of the second operational amplifier 16 is connected to the first ground side terminal G1. The inversion input terminal of the first operational amplifier 15 is connected to the second load terminal (b) of the load 103.

The charged particle beam control device 100 further includes the deflection control unit 110 that generates the control signal for setting the amount of the current to be applied to the electromagnetic deflector 103 as the load. The control signal V1 from the deflection control unit 110 is input to the control signal input unit 2. The current control circuit 1 supplies the current to the electromagnetic deflector 103 based on the control signal V1 from the control signal input unit 2.

The differential amplification unit 5 inverts the voltage difference between the voltage of the first ground side terminal G1 and the voltage of the second ground side terminal G2 by −1, and outputs a result to the output terminal (c). The second resistor R4 and the third resistor R9 have resistance values same as that of the first resistor R2.

In the third embodiment, since the voltage polarity of the control signal generated by the deflection control unit 110 is identical with the polarity of the current output to the load, the effect of facilitating the control algorithm of the deflection control unit 110 is obtained. In the first and second embodiments, when the resistance R3 is not a sufficiently large value as compared with the resistor R1, the current Id increases or decreases greatly due to the amount of the current flowing through the resistor R3. However, the circuit design in the third embodiment is easy since all the currents Id flow through the resistor R1.

REFERENCE SIGN LIST 100 charged particle beam control device
101 electron gun
102 electron beam
103 electromagnetic deflector
104 sample
105 secondary electron
106 reflector
107 detector
108 signal processing and image generation unit
109 computer
110 deflection control unit
111 constant current source
1 current control circuit
2 control signal input unit
103 load
4 current conversion unit
5 differential amplification unit
6 correction unit
11, 14, 15 and 16 operational amplifier
12 NMOS transistor
13 PMOS transistor
21 power supply interface

The invention claimed is:

1. A charged particle beam control device that converts reflected electrons generated by irradiating a sample with a charged particle beam into an electrical signal and processes the electrical signal, the charged particle beam control device comprising:

a constant current source including a current control circuit that supplies a current to a load based on a control signal for setting an amount of the current to be applied to the load, wherein the current control circuit includes a current conversion unit that supplies a constant current by adjusting an amount of a current flowing through a current detection resistor based on the control signal, a differential amplification unit to which a voltage of a first ground side terminal of the control signal and a voltage of a second ground side terminal of the current detection resistor are input, and that outputs an output signal proportional to a voltage difference between the voltage of the first ground side terminal and the voltage of the second ground side terminal, and a correction unit to which the output signal output from the differential amplification unit and the control signal are input, and that adds the output signal to the control signal at a predetermined ratio.

2. The charged particle beam control device according to claim 1, further comprising:

a deflection control unit that generates the control signal for setting the amount of the current to be applied to an electromagnetic deflector as the load, wherein the constant current source further includes a control signal input unit to which the control signal from the deflection control unit is input, and the current control circuit supplies the current to the electromagnetic deflector based on the control signal from the control signal input unit.

3. The charged particle beam control device according to claim 1, wherein the current conversion unit further includes an operational amplifier, and the correction unit adds the output signal to the control signal at the predetermined ratio using an addition circuit of the operational amplifier.

4. A charged particle beam control device that converts reflected electrons generated by irradiating a sample with a charged particle beam into an electrical signal and processes the electrical signal, the charged particle beam control device comprising:

a constant current source that supplies a current to a load based on a control signal for setting an amount of the current to be applied to the load, wherein the constant current source includes a control signal input unit to which the control signal is supplied and that includes a first ground side terminal serving as a voltage reference of the control signal, and a current control circuit that supplies the current to the load based on the control signal from the control signal input unit, the current control circuit includes a voltage drive transistor that includes a drive terminal, a first terminal and a second terminal, and causes a constant current to flow between the first terminal and the second terminal by supplying a drive voltage to the drive terminal, a current detection resistor that is connected between a second ground side terminal and a second load terminal of the load, a first load terminal of the load being connected to the second terminal of the voltage drive transistor, an operational amplifier that supplies the drive voltage to the drive terminal of the voltage drive transistor, and a differential amplification unit to which a voltage of a first ground side terminal and a voltage of a second ground side terminal are input, and that outputs a voltage proportional to a voltage difference between the voltage of the first ground side terminal and the voltage of the second ground side terminal to an output terminal, and a first terminal of a first resistor is connected to the control signal input unit, a first terminal of a second resistor is connected to the output terminal of the differential amplification unit, second terminals of the first resistor and the second resistor are connected to each other, the second terminal of the first resistor is connected to an inversion input terminal of the operational amplifier, and a third resistor is connected between the inversion input terminal of the operational amplifier and the second load terminal of the load.

5. The charged particle beam control device according to claim 4, further comprising:

a deflection control unit that generates the control signal for setting the amount of the current to be applied to an electromagnetic deflector as the load, wherein the control signal from the deflection control unit is input to the control signal input unit, and the current control circuit supplies the current to the electromagnetic deflector based on the control signal from the control signal input unit.

6. The charged particle beam control device according to claim 4, wherein the inversion input terminal of the operational amplifier is connected to the first ground side terminal, the differential amplification unit inverts a voltage difference between the voltage of the first ground side terminal and the voltage of the second ground side terminal by −1, and outputs a result to the output terminal, and the second resistor has a resistance value same as that of the third resistor.

7. The charged particle beam control device according to claim 4, wherein a non-inversion input terminal of the operational amplifier is connected to the second ground side terminal, the differential amplification unit doubles a voltage difference between the voltage of the first ground side terminal and the voltage of the second ground side terminal, and outputs a result to the output terminal, and the second resistor has a resistance value same as that of the first resistor.

8. A charged particle beam control device that converts reflected electrons generated by irradiating a sample with a charged particle beam into an electrical signal and processes the electrical signal, the charged particle beam control device comprising:

a constant current source that supplies a current to a load based on a control signal for setting an amount of the current to be applied to the load, wherein the constant current source includes a control signal input unit to which the control signal is supplied and that includes a first ground side terminal serving as a voltage reference of the control signal, and a current control circuit that supplies the current to the load based on the control signal from the control signal input unit, the current control circuit includes a voltage drive transistor that includes a drive terminal, a first terminal and a second terminal, and causes a constant current to flow between the first terminal and the second terminal by supplying a drive voltage to the drive terminal, a current detection resistor that is connected between a second ground side terminal and a second load terminal of the load, a first load terminal of the load being connected to the second terminal of the voltage drive transistor, a first operational amplifier that supplies the drive voltage to the drive terminal of the voltage drive transistor, and a differential amplification unit to which a voltage of a first ground side terminal and a voltage of a second ground side terminal are input, and that outputs a voltage proportional to a voltage difference between the voltage of the first ground side terminal and the voltage of the second ground side terminal to an output terminal, and a first terminal of a first resistor is connected to the control signal input unit, a first terminal of a second resistor is connected to the output terminal of the differential amplification unit, second terminals of the first resistor and the second resistor are connected to each other, the second terminal of the first resistor is connected to an inversion input terminal of a second operational amplifier, a third resistor is connected between the inversion input terminal of the second operational amplifier and an output terminal of the second operational amplifier, the output terminal of the second operational amplifier is connected to a non-inversion input terminal of the first operational amplifier, a non-inversion input terminal of the second operational amplifier is connected to the first ground side terminal, and an inversion input terminal of the first operational amplifier is connected to the second load terminal of the load.

9. The charged particle beam control device according to claim 8, further comprising:

a deflection control unit that generates the control signal for setting the amount of the current to be applied to an electromagnetic deflector as the load, wherein the control signal from the deflection control unit is input to the control signal input unit, and the current control circuit supplies the current to the electromagnetic deflector based on the control signal from the control signal input unit.

10. The charged particle beam control device according to claim 8, wherein the differential amplification unit inverts the voltage difference between the voltage of the first ground side terminal and the voltage of the second ground side terminal by −1, and outputs a result to the output terminal, and the second resistor and the third resistor have resistance values same as that of the first resistor.

* * * * *